(12) United States Patent
Family et al.

(10) Patent No.: US 10,237,645 B2
(45) Date of Patent: Mar. 19, 2019

(54) AUDIO SYSTEMS WITH SMOOTH DIRECTIVITY TRANSITIONS

(71) Applicant: Apple Inc., Cupertino, CA (US)

(72) Inventors: Afrooz Family, Emerald Hills, CA (US); John H. Sheerin, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/619,058

(22) Filed: Jun. 9, 2017

(65) Prior Publication Data

US 2018/0352325 A1    Dec. 6, 2018

Related U.S. Application Data

(60) Provisional application No. 62/514,929, filed on Jun. 4, 2017.

(51) Int. Cl.

| H04R 1/02 | (2006.01) |
|---|---|
| H04R 1/40 | (2006.01) |
| H04R 3/12 | (2006.01) |
| H04R 3/04 | (2006.01) |
| H03G 5/16 | (2006.01) |
| H04R 3/00 | (2006.01) |

(52) U.S. Cl.
CPC ............. *H04R 1/403* (2013.01); *H03G 5/165* (2013.01); *H04R 3/04* (2013.01); *H04R 3/12* (2013.01); *H04R 2201/401* (2013.01); *H04R 2430/25* (2013.01)

(58) Field of Classification Search
CPC . H04R 1/403; H04R 3/04; H04R 3/12; H04R 2201/401; H03G 5/165
USPC .................................................. 381/335, 92
See application file for complete search history.

(56) References Cited

U.S. PATENT DOCUMENTS

| 3,727,178 A | 4/1973 | Stedtnitz | |
|---|---|---|---|
| 2007/0098192 A1 | 5/2007 | Sipkema | |
| 2013/0223658 A1* | 8/2013 | Betlehem | H04R 5/02 381/307 |
| 2017/0295437 A1* | 10/2017 | Bertelsen | H04R 25/353 |

FOREIGN PATENT DOCUMENTS

| GB | 2418332 A | 3/2006 |
|---|---|---|
| JP | 2006047187 A2 | 2/2006 |

* cited by examiner

*Primary Examiner* — Xu Mei
*Assistant Examiner* — Ammar T Hamid
(74) *Attorney, Agent, or Firm* — Ganz Pollard, LLC (57) ABSTRACT

An audio system includes a loudspeaker cabinet defining a longitudinal axis. Several loudspeaker transducers are distributed around the longitudinal axis. The audio system includes an audio rendering processor to cause the loudspeaker transducers to emit a sound field approximating a desired contour. The desired contour can be decomposed into a combination of several constituent modal beam components, and the audio rendering processor can render a truncated version of the decomposition to render an approximation of the desired contour. The desired contour can be one of a plurality of contours stored in a memory, or can be user defined. The cabinet includes a processor and a memory having instructions that, when executed by the processor, cause the audio system decompose a desired contour and to render a truncated version of the decomposition. Related principles are described by way of reference to method and apparatus examples.

20 Claims, 11 Drawing Sheets

AUDIO SYSTEMS WITH SMOOTH DIRECTIVITY TRANSITIONS

RELATED APPLICATIONS

This application claims benefit of and priority to U.S. Provisional Patent Application No. 62/514,929, filed on Jun. 4, 2017, which application is hereby incorporated by reference in its entirety for all purposes.

BACKGROUND

This application, and the innovations and related subject matter disclosed herein, (collectively referred to as the "disclosure") generally concern systems for providing sound fields having smoothly changing, or constant, directivity with frequency. More particularly but not exclusively, some disclosed principles are embodied as an audio device configured to render an approximation to a desired sound field throughout a listening environment by rendering a truncated decomposition of the desired sound field. In some, but not all, embodiments, the desired sound field can be user defined.

Conventional audio systems and acoustic beam formers project a sound field into a listening environment in a fixed, or stationary, manner regardless of the listening environment in which they are installed. As well, directivity of conventional audio systems varies with, among other parameters, acoustic frequency.

Consequently, many conventional systems offer "optimal" playback in only one installation arrangement and at one listening position within a given listening environment. As well, many conventional audio systems are best-suited for only certain types or classes of audio (e.g., certain classes of music, motion-picture soundtracks, etc.). Nonetheless, a given audio system will generally be installed throughout a wide variety of environments, e.g., room sizes, elevations within a room, desk- or table-tops, book cases, near walls, near room corners, etc. And, many audio systems for consumers will be called on to playback a variety of classes of music, as well as motion-picture soundtracks.

In short, conventional audio systems provide deficient listening experiences for users.

Thus, a need exists for an audio system capable of rendering a sound field tailored to the listening environment in which it is installed. A need also exists for an audio system capable of rendering customizable, or user-definable, sound fields. Further, a need exists for an audio system that provides smooth directivity and/or smoothly varying sound fields throughout the audible spectrum of frequencies, or sub-bands thereof.

SUMMARY

The innovations disclosed herein overcome many problems in the prior art and address one or more of the aforementioned or other needs. In some respects, the innovations disclosed herein generally concern systems and associated techniques for providing sound fields having smoothly changing, or constant, directivity with frequency. For example, some disclosed audio systems can project a desired sound field throughout a listening environment. Some disclosed systems provide sound fields having smooth directivity throughout the audible spectrum of frequencies. And, some disclosed audio systems can render user-defined sound fields.

As but one example, an audio system can have an array of loudspeaker transducers constituting a portion of a beam former to render a sound field. The audio system can also include a processor and a memory containing instructions that, when executed by the processor, cause the audio system to define a shape of a desired sound field as a weighted combination of modal beam components, and to receive an audio signal containing an audio content. In decomposing the desired sound field into the combination of modal beam components, the audio system can perform a Fourier decomposition of the shape of the desired sound field resulting in the weighted combination of modal shapes.

For each loudspeaker transducer, the audio device can filter a received audio signal according to the respective combination of modal shapes. And, each loudspeaker transducer can emit the filtered audio signal for the respective loudspeaker transducer. Thereby, the audio system can render the audio content throughout a listening environment in a manner corresponding to the desired sound field.

To adjust the audio system's variation in directivity with frequency, a frequency equalization can be applied to each modal beam component, and the shape of the desired sound field can be approximated as a weighted combination of the equalized modal beam components. The audio signal can then be filtered according to the combination of equalized modal beam components and for each respective loudspeaker transducer. Subsequently, each loudspeaker transducer can radiate sound according to the filtered audio signal for that respective loudspeaker transducer, thereby allowing the audio system to render an approximation to the desired sound field.

Some audio systems can receive an input associated with the shape of the desired sound field, and, based at least in part on the input, determine the shape of the desired sound field. Such audio systems can decompose the shape of the desired sound field into a corresponding weighted combination of modal beam components. For example, the input can be a user input representative of a listening environment, or a sensor input indicative of the environment in which the audio system is installed.

A cross-sectional profile of the loudspeaker cabinet can define a circle. The array of loudspeaker transducers can be distributed around an outer surface of the loudspeaker cabinet. For example, the loudspeaker cabinet can have a cylindrical portion defining a central longitudinal axis. The array of loudspeaker transducers can be circumferentially distributed around the central longitudinal axis.

Also disclosed are associated methods, as well as tangible, non-transitory computer-readable media including computer executable instructions that, when executed, cause a computing environment to implement one or more methods disclosed herein. Digital signal processors embodied in software, firmware, or hardware are suitable for implementing such instructions are also disclosed.

The foregoing and other features and advantages will become more apparent from the following detailed description, which proceeds with reference to the accompanying drawings.

BRIEF DESCRIPTION OF THE DRAWINGS

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation.

DETAILED DESCRIPTION

The following describes various innovative principles related to systems for providing sound fields having smoothly changing, or constant, directivity with frequency. For example, certain aspects of disclosed principles pertain to an audio device configured to project a desired sound field, or an approximation thereof, throughout a listening environment. In some, but not all, embodiments, the desired sound field can be user defined. Embodiments of such systems described in context of specific apparatus configurations and combinations of method acts are but particular examples of contemplated systems, chosen as being convenient illustrative examples of disclosed principles. One or more of the disclosed principles can be incorporated in various other audio systems to achieve any of a variety of corresponding system characteristics.

Thus, systems having attributes that are different from those specific examples discussed herein can embody one or more presently disclosed innovative principles, and can be used in applications not described herein in detail. Accordingly, such alternative embodiments also fall within the scope of this disclosure.

I. Overview

Figure 1:
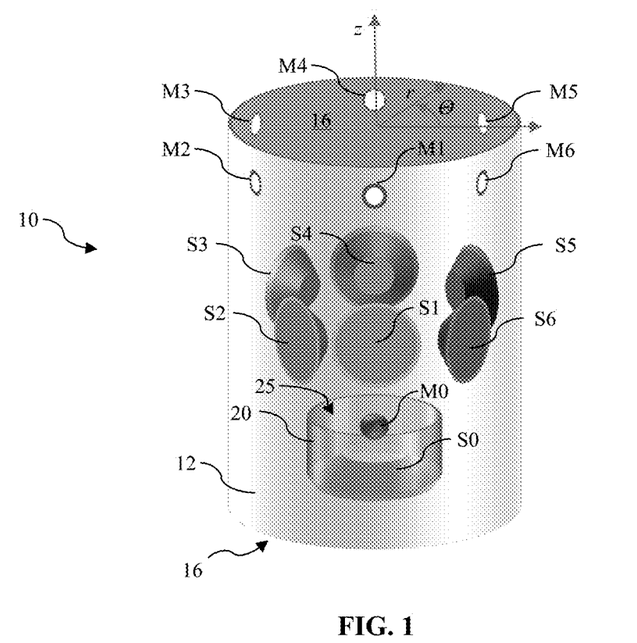
FIG. 1 illustrates an embodiment of an audio device.
Figure 2:
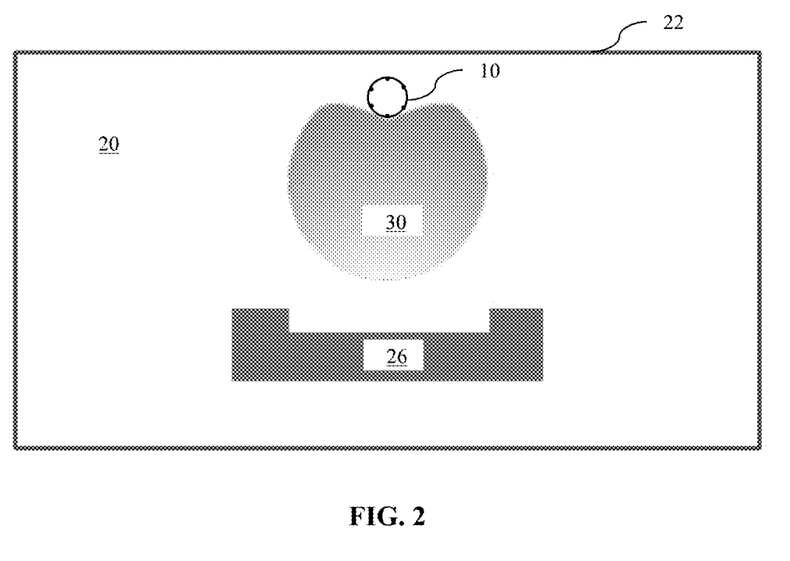
FIG. 2 illustrates a desired sound field corresponding to a representative listening environment.

Referring now to FIGS. 1 and 2, an audio device 10 can be positioned in a room 20. A desired sound-field 30 to be rendered by the audio device 10 can correspond to a position of one or more reflective boundaries, e.g., a wall 22, relative to the loudspeaker cabinet 10, as well as a listener's likely position 26 relative to the loudspeaker cabinet.

Figure 3:
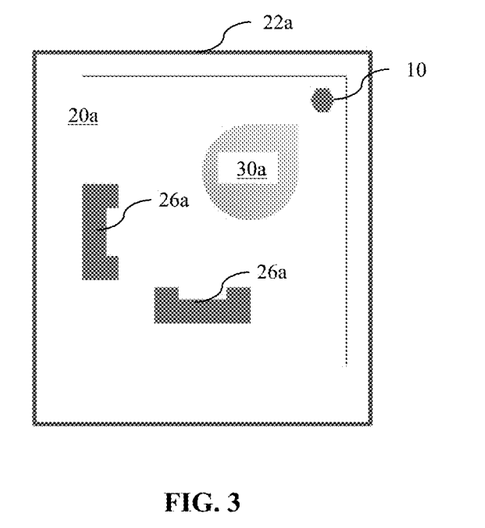
FIG. 3 illustrates another desired sound field corresponding to another representative listening environment.
Figure 4:
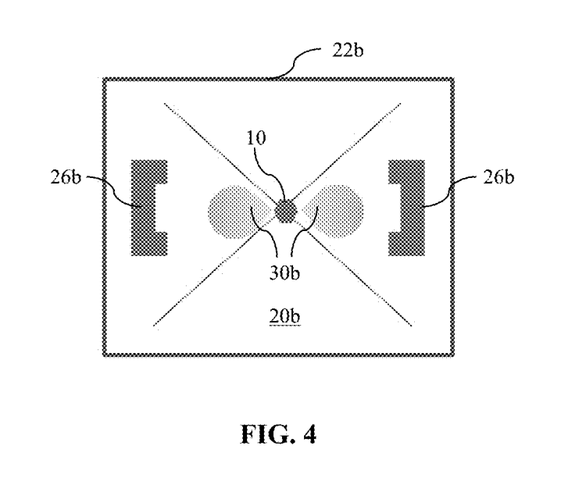
FIG. 4 illustrates yet another desired sound field corresponding to yet another representative listening environment.

Innovative principles disclosed herein can be adopted to cause an audio device 10 to render an approximation to a desired sound field, e.g., the desired sound field 30 shown in FIG. 2. Of course, other shapes of desired sound fields also are possible, as room configuration, listening position, and position of the audio device 10 can vary among different rooms. FIGS. 3 and 4 show other exemplary representations of desired sound fields 30a, 30b corresponding to, for example, different listening positions 26a, 26b, placement of the audio device 10 relative to walls 22a, 22b and shape of the respective rooms 20a, 20b.

As will be explained more fully below, a desired shape of a sound field 30 can be approximated by a combination of component modal shapes. In many circumstances, the combination of component modal shapes used to achieve a desired sound field will change among different audio frequencies, or frequency bands, as efficiency of the audio device 10 while producing each modal shape typically varies among frequencies. Nonetheless, a filter can be devised to account for such frequency dependence, and disclosed audio devices can apply the filter to an acoustic signal containing an audio content to render a sound field approximating a desired sound field.

Section II describes principles related to such an audio device by way of reference to the device depicted in FIG. 1. Section III describes principles pertaining to desired sound-field shapes, and Section IV describes principles related to decomposing a shape of a desired sound field into a combination of modal components. Section V discloses principles relating to directivity of an audio device and variation thereof with frequency. Section VI describes principles related to audio processors suitable to render an approximation of a desired sound field from an incoming audio signal containing an audio content. Section VII describes principles related to computing environments suitable for implementing disclosed processing methods.

Other, related principles also are disclosed. For example, the following describes machine-readable media containing instructions that, when executed, cause a processor of, e.g., a computing environment, to perform one or more disclosed methods. Such instructions can be embedded in software, firmware, or hardware. In addition, disclosed methods and techniques can be carried out in a variety of forms of signal processor, again, in software, firmware, or hardware. Additional details of disclosed principles follow.

II. Audio Devices

FIG. 1 shows an audio device 10 that includes a loudspeaker cabinet 12 having integrated therein a loudspeaker array including a plurality of individual loudspeaker transducers $S_1, S_2, \ldots, S_6$.

In general, a loudspeaker array can have any number of individual loudspeaker transducers, despite that the illustrated array has six loudspeaker transducers. The number of loudspeaker transducers depicted in FIG. 1 is selected for convenience of illustration. Other arrays have more or fewer than six transducers, and may have more than one row of transducers. For example, an embodiment of an array for the audio device 10 can have 2, 3, 4, 5, 6, 7, 8, 9, 10, 11, or more, loudspeaker transducers.

In FIG. 1, the cabinet 12 has a generally cylindrical shape defining a central, longitudinal axis z arranged perpendicularly to the opposed ends 16 of the cylindrical cabinet.

Each of the loudspeaker transducers $S_1, S_2, \ldots, S_6$ in the illustrated loudspeaker array may be arranged side-by-side and circumferentially distributed around the central longitudinal axis of the cabinet 10. In the illustrated embodiment, the loudspeaker transducers $S_1, S_2, \ldots, S_6$ in the loudspeaker array are distributed evenly around the longitudinal axis at a constant, or a substantially constant, longitudinal position relative to, and radial distance from, the axis. In FIG. 1, the loudspeaker transducers are circumferentially spaced from each other by about 60 degrees.

Other arrangements for the loudspeaker transducers are possible. For instance, the loudspeaker transducers in the array may be distributed evenly (e.g., around the longitudinal axis separated from adjacent microphones by a constant angle, Θ, or at least one loudspeaker transducer for each outwardly facing surface of a cabinet shaped as a rectangular prism) within the loudspeaker cabinet 10, or unevenly. As well, the loudspeaker transducers $S_1, S_2, \ldots, S_6$ can be positioned at various selected longitudinal positions measured along the longitudinal axis, rather than at one longitudinal position as shown in FIG. 1. For example, each loudspeaker transducer can be distributed among tow or more circumferential rows. Each transducer $S_0, S_1, \ldots, S_6$ may be an electrodynamic or other type of driver that may be specially designed for sound output at particular frequency bands, such as a subwoofer, tweeter, or midrange driver, for example. In some embodiments, the audio device 10 has but one individual loudspeaker transducer. In FIG. 1, a seventh loudspeaker transducer S0 is shown to supplement output from the array. For example, the supplemental loudspeaker transducer S0 can be so configured to radiate selected frequencies, e.g., low-end frequencies as a subwoofer.

Although the loudspeaker cabinet 10 is shown as being cylindrical, other embodiments of a loudspeaker cabinet 10 have another shape. For example, some loudspeaker cabinets can be arranged as, e.g., a triangular, rectangular, pentagonal, or other general prismatic structure, a tetrahedral structure, a spherical structure, an ellipsoidal structure, a toroidal structure, or as any other desired three-dimensional shape. As well, the loudspeaker transducers of the array can be positioned in arrangements other than being distributed about the enclosure. For example, the loudspeaker transducers of the array can be arranged in one or more linear rows, as in the style of a sound bar.

III. Desired Sound Fields

Referring again to FIG. 2, the audio device 10 can be positioned close to a wall 22. In such a situation, as noted above, directing a sound field 30 toward an interior region of the room, e.g., toward a listener's position 26, can be desirable. FIG. 3 depicts the audio device shown in FIG. 1 in a different position than is shown in FIG. 2. In FIG. 2, the sound field 30 has a nearly cardioid shape to direct sound to the user's likely listening position 26 in the room 20, while directing little or no acoustic energy toward the wall 22. By not projecting acoustic energy toward the wall, a user's listening experience can be enhanced in comparison to an experience provided by an omnidirectional speaker in a similar position. For example, delayed reflections from the wall, as perceived at a listening position 26, can be reduced with the sound field shown FIG. 2, compared to the perceived reflections at the listening position that otherwise would result from positioning an omnidirectional loudspeaker adjacent the wall 22. And, a greater portion of the acoustic energy emitted by the audio device 10 can be directed toward a listener, as compared to an omnidirectional loudspeaker. Accordingly, a user can perceive the audio device 10 as having greater intelligibility than an omnidirectional loudspeaker. And, the sound field shown in FIG. 2 also prevents or mitigates emission of unwanted sound beyond the wall 22 at a given listening volume perceived at the listening position 26.

Although the sound field shown in FIG. 3 is different from that shown in FIG. 2, the sound field shown in FIG. 3 can be well suited to the loudspeaker's illustrated position compared to the wall 22 and the likely listening positions 26 shown in FIG. 3. And, FIG. 4 shows the audio device 10 in yet another position in a room, and a corresponding different desirable sound field suitable for the arrangement of listening positions 26, wall positions 22, and room arrangement compared to the position of the audio device 10 shown in FIG. 4

Notably, none of the desired sound fields shown in FIGS. 2, 3 and 4 is axisymmetric, or omnidirectional, relative to the axis z (FIG. 1). In contrast, the cylindrical cabinet 12 depicted in FIG. 1 is generally axisymmetric, though not formally axisymmetric insofar as the microphones and loudspeaker transducers (and other components) represent discrete, rather than continuous, structures positioned circumferentially around the axis z.

In any event, representing desired sound fields using polar coordinates with the z-axis of the audio device 10 positioned at the origin can be useful, as will be more apparent from the description below.

In some embodiments of audio devices, a desired sound field can be defined based on an input. For example, a user can "draw," as on a touch screen, a contour representative of a desired sound field relative to the audio device 10. In another example, a user can "draw" contours representative of one or more room boundaries and large furniture (e.g., book cases, sofas, tables, etc.) items positioned throughout the room, as well as a desired position of the audio device 10 in the room.

In such an embodiment, the audio device 10 can discern a desired sound field contour. In still other embodiments, a user can select from a plurality of desired sound field shapes stored by the audio device 10 or remotely. If stored remotely, the audio device 10 can load the selected sound field shape over a communication connection. And in still further embodiments, a user can draw a shape of a desired sound field or room boundary, as above, on a smart phone or a tablet, and the audio device 10 can receive a representation of the desired sound field or room boundary directly or indirectly from user's device over a communication connection. Other forms of user input than touch screens can be used, as described more fully below in connection with computing environments.

As well, the input need not be limited to a manual user input. Rather, one or more sensors can detect one or more aspects of a listening environment, and in response, infer a contour of a suitable or desired sound field. Whether user-defined or inferred by the audio system, a sound field can be rendered by the device using principles described herein.

IV. Modal Decomposition of Desired Sound Field

Figure 5:
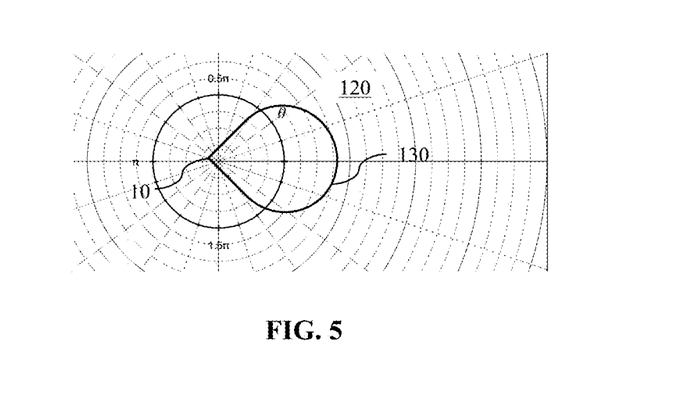
FIG. 5 illustrates a representation of the sound field shown in FIG. 3 plotted on the r-Θ plane using polar coordinates.
Figure 6:
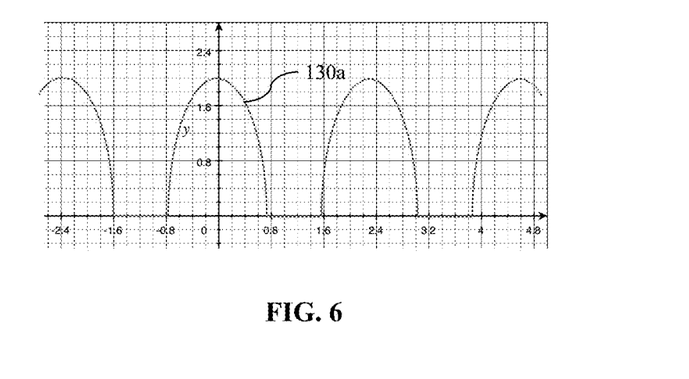
FIG. 6 illustrates the sound-field representation depicted in FIG. 5 plotted on the r-Θ plane using Cartesian coordinates.

FIG. 5 shows the desired sound field in FIG. 3 represented using polar coordinates on the r-Θ plane, with the z-axis of the audio device 10 being positioned at the origin. In FIG. 5, the sound field 130 is rotated by about 225 degrees compared to the sound field 30 shown in FIG. 3. FIG. 6 shows the sound field 130 from FIG. 5 represented using Cartesian coordinates, having simply undergone a coordinate transformation from polar- to Cartesian-coordinates.

The curve shown in FIGS. 5 and 6 can be approximated using any of a variety of known forms of series approximations. A Fourier decomposition can be convenient, and a so-called Fast Fourier Transformation (FFT) can be particularly convenient, to determine a series-sum of modal shapes that approximate the curves shown in FIGS. 5 and 6, as any curve can be approximated by a combination of sinusoids. Table 1, below, lists the first three modes (modal beam components) of a decomposition of a desired beam shape, as well as a generalization to an arbitrary $n^{th}$-order modal beam component.

TABLE 1

Exemplary Modal Beam Components

| | |
|---|---|
| First Order Beam Components | $\alpha_1 \cos(\Theta + \Phi) + \beta_1 \sin(\Theta + \Phi)$ |
| Second Order Beam Components | $\alpha_2 \cos(2\Theta + \Phi) + \beta_2 \sin(2\Theta + \Phi)$ |
| Third Order Beam Components | $\alpha_3 \cos(3\Theta + \Phi) + \beta_3 \sin(3\Theta + \Phi)$ |
| $n^{th}$ Order Beam Components | $\alpha_n \cos(n\Theta + \Phi) + \beta_n \sin(n\Theta + \Phi)$ |

In addition to the modal beam components listed in Table 1, above, a constant offset, e.g., a "zero-th order" beam component ($\alpha_0 \cos(0\Theta - \Phi) + \beta_0 \sin(0\Theta + \Phi)$), which reduces to a constant, $\alpha_0$ can be included in a series-sum approximation to a desired beam shape, e.g., as with the desired beam shape in FIGS. 5 and 6.

The coefficients $\alpha_n$ and $\beta_n$ reflect amplitudes of the modal beam shapes in space, and the phase, $\Phi$, represents an orientation of the desired beam shape. For example, the desired beam shape shown FIG. 3 is rotated by 225 degrees relative to the beam shape depicted in FIG. 5. Thus, once modal beam components are selected and the coefficients are determined to approximate the contour of the beam depicted in FIG. 5, the shape can be rotated in space to the orientation shown in FIG. 3 by setting the phase, $\Phi$, to 225 degrees $$\left(\text{i.e., } \frac{5\pi}{4}\right)$$

to virtually rotate the loudspeaker or by actually rotating the audio device 10.

Figure 7:
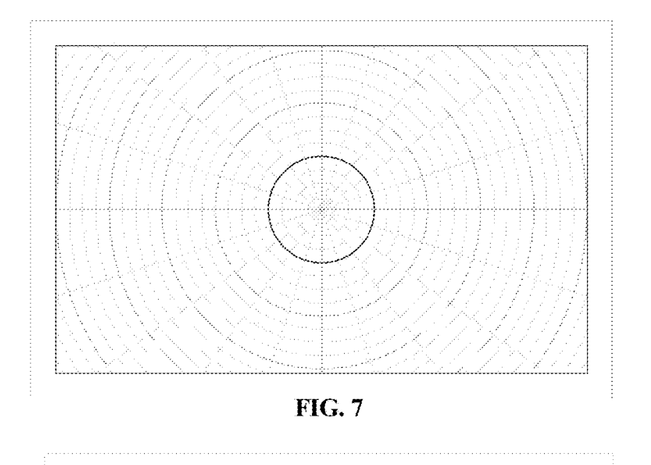
FIGS. 7, 9, 11, 13, 15, 17, and 19 illustrate plots on the r-Θ plane using polar coordinates of modal components and combinations thereof that can be combined to approximate a desired sound field.
Figure 8:
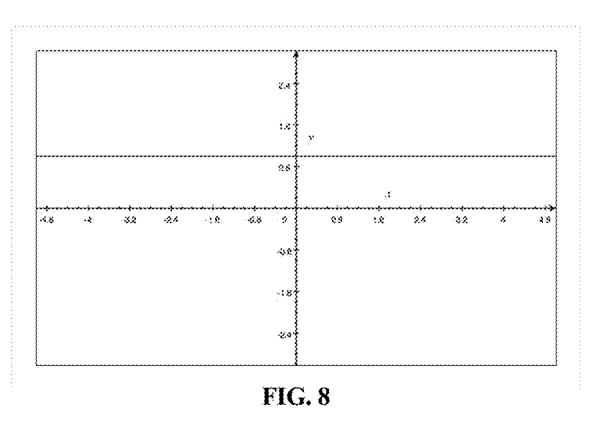
FIGS. 8, 10, 12, 14, 16, 18, and 20 illustrate plots on the r-Θ plane using Cartesian coordinates of the modal components and combinations shown in FIGS. 7, 9, 11, 13, 15, 17, and 19.

Referring now to FIG. 7, there is shown an omni-directional beam shape, $r = \alpha_0$. FIG. 8 represents that omnidirectional beam in Cartesian coordinates. Accordingly, to emit a sound field having an omnidirectional beam shape from the audio device 10, each of the loudspeaker transducers $S_1 \ldots S_6$ (FIG. 1) positioned around the cabinet 12 can be driven equally.

Figure 9:
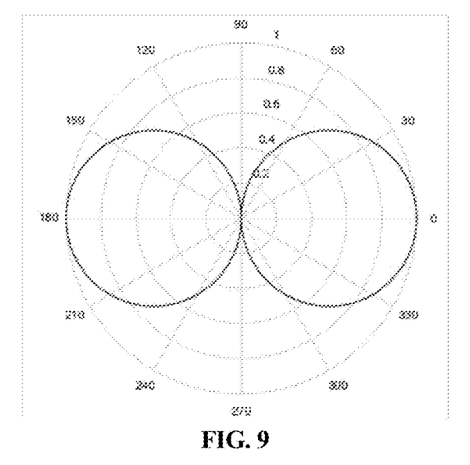
Figure 10:
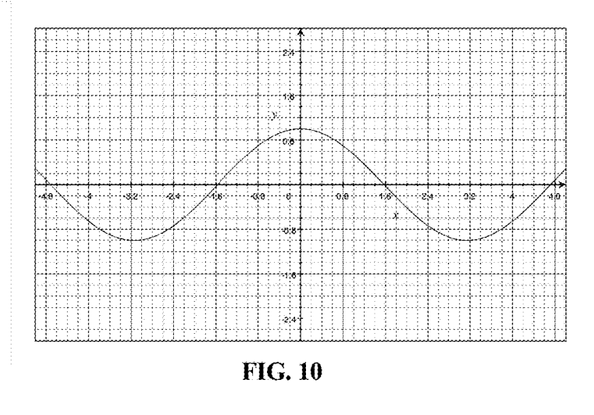

FIG. 9 shows a beam shape defined by $r = \alpha_1 \cos(\Theta)$, and FIG. 10 shows that beam transferred to Cartesian coordinates. Accordingly, to emit a sound field from the audio device 10 having a beam shape as shown in FIG. 9, each of the loudspeaker transducers $S_1 \ldots S_6$ (FIG. 1) positioned around the cabinet 12 can be driven in proportion to the cosine of its circumferential position, $\Theta$, relative to a reference position on the audio device 10 (e.g., a position of a selected loudspeaker transducer, e.g., transducer S1).

Figure 11:
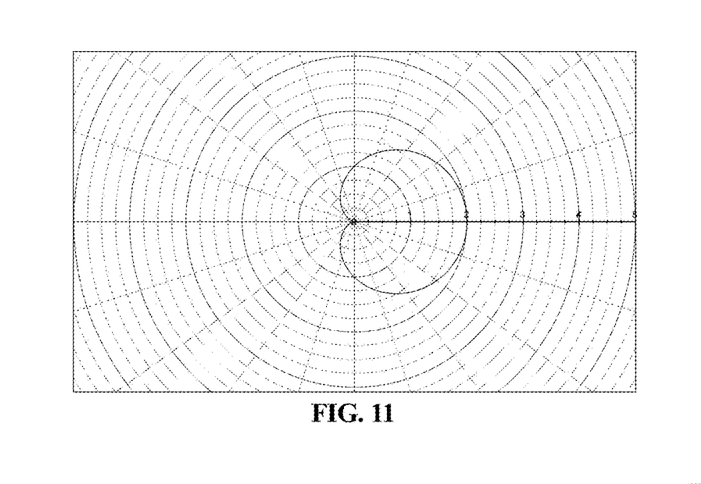
Figure 12:
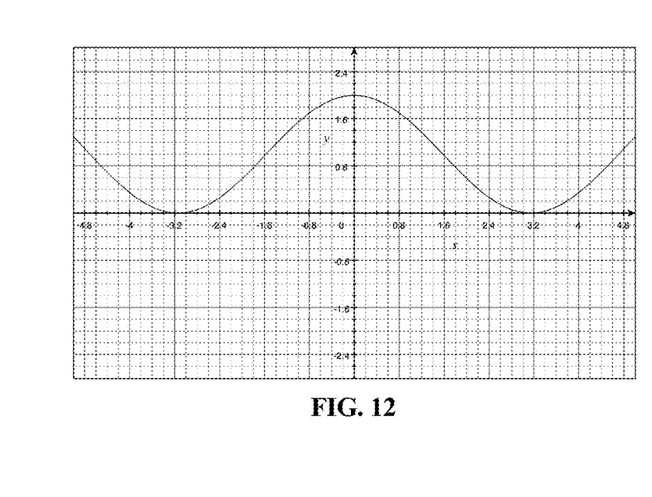

The cardioid beam shape shown in FIG. 11 is defined by $r = 1 + \cos(\Theta)$, and FIG. 12 reflects that beam shape in Cartesian coordinates. Thus, to produce a sound field having a cardioid shape, each of the loudspeaker transducers $S_1 \ldots S_6$ (FIG. 1) positioned around the cabinet 12 can be driven in proportion to one plus the cosine of its circumferential position, $\Theta$, relative to the selected reference position on the audio device 10.

Figure 13:
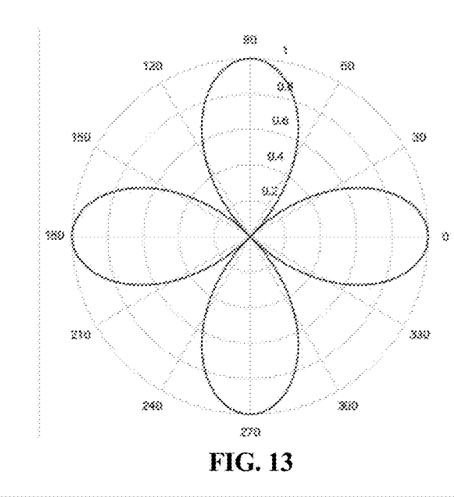
Figure 14:
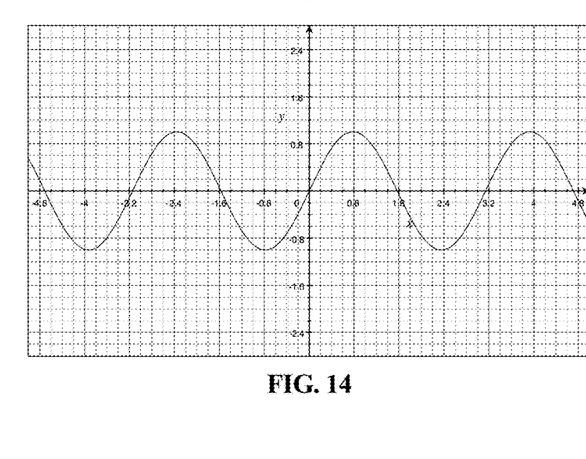
Figure 15:
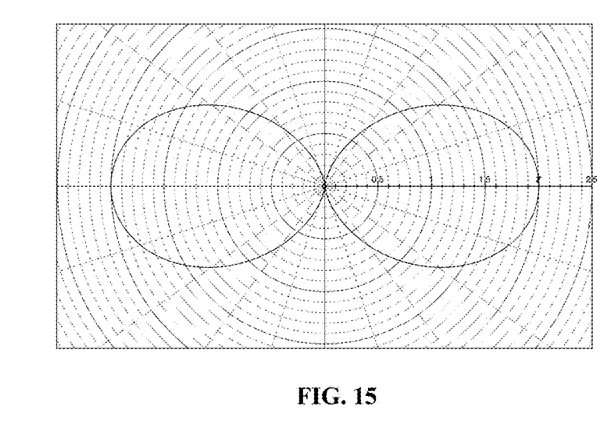
Figure 16:
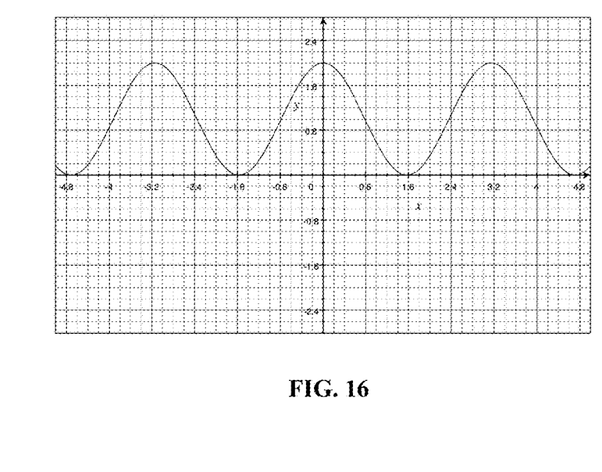
Figure 17:
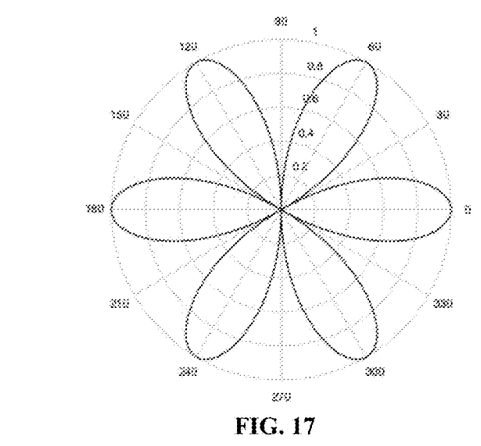
Figure 18:
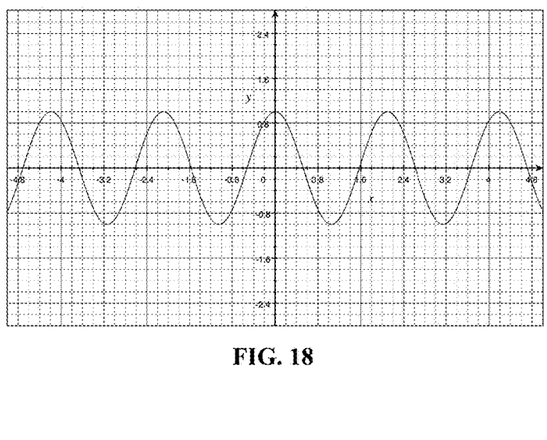

The quadrupole shown in FIG. 13, and its Cartesian equivalent in FIG. 14, are generated from the second-order beam components shown in Table 1, setting $\alpha_2$ and $\Phi$ to zero, and $\beta_2$ to one, leaving $\sin(2\Theta)$. The multi-lobe beam shown in FIG. 15, and its Cartesian equivalent in FIG. 16, are also generated from combining the "zeroth order" component with the second-order component setting $\beta_2$ and $\Phi$ to zero, and setting $\alpha_0$ and $\alpha_2$ to one, leaving $1 + \cos(2\Theta)$. Similarly, the hexapole in FIG. 17 and its Cartesian equivalent shown in FIG. 18 are generated from $\sin(3\Theta)$, which can be derived as above from the third-order beam component shown in Table 1.

Figure 19:
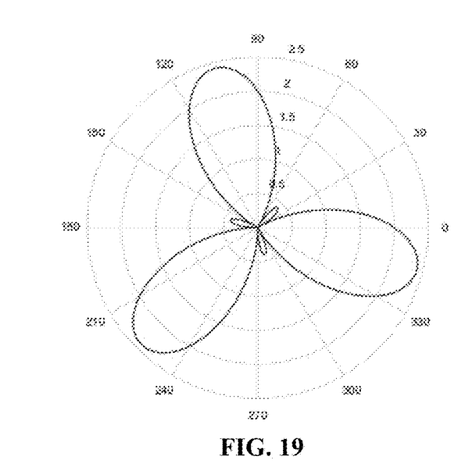
Figure 20:
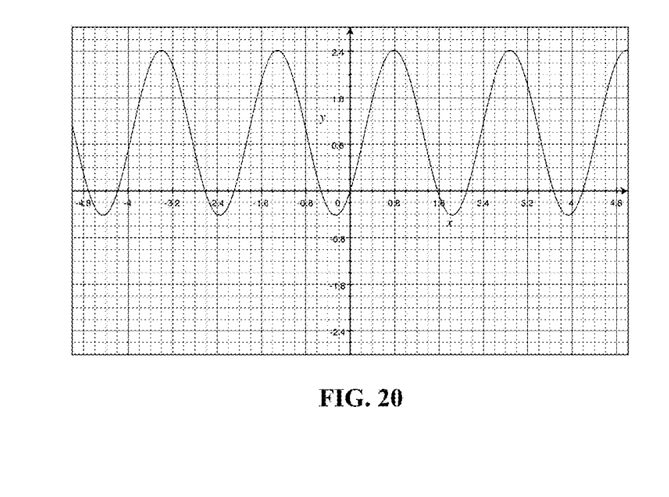

As one further example, the "lobed tripole" shown in FIG. 19 and its Cartesian equivalent in FIG. 20 are also generated from the third-order beam components, combined with a constant from the "zeroth-order". In particular, the shape is generated by setting $\alpha_0 = 1$, $\alpha_3 = 1$, $\Phi = 0$, and $\beta_3 = -1$, leaving $1 + \cos(3\Theta) - \sin(3\Theta)$. As most easily seen in FIG. 20, the amplitude of the beam pattern shown in FIG. 19 turns slightly negative at some points, reflected by the small lobes contained within the larger lobes in FIG. 19, indicating that a portion of the sound field corresponding to those small lobes will be out of phase with most of the sound field.

Figure 21:
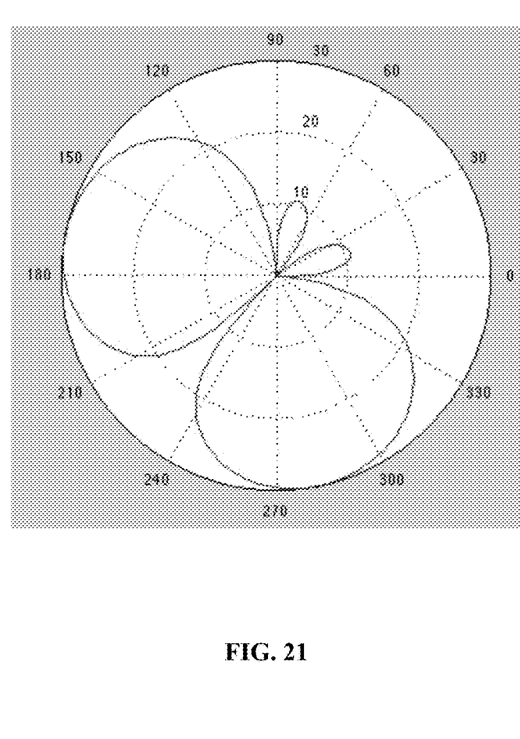
FIG. 21 shows an estimated sound field computed for a working embodiment of disclosed principles under a selected Directivity Index.

Computation of a desired beam pattern using a working embodiment of disclosed principles will now be described in relation to FIG. 21. A combination leading to a desired beam pattern from component beam patterns can be described using vector notation, in a complex representation, follows:

$$BP_{comp} = [BP_{(1)} BP_{(2)} + j^* BP_{(3)} BP_{(4)} + j^* BP_{(5)} BP_{(6)} + j^* BP_{(7)}]$$

where $BP_{comp}$ is the complex representation of the desired beam pattern;

$BP_{(1)}$ is the zero-th order component;
$BP_{(2)}$ is the first-order cosine component;
$BP_{(3)}$ is the first-order sine component;
$BP_{(4)}$ is the second-order cosine component;
$BP_{(5)}$ is the second-order sine component;
$BP_{(6)}$ is the third-order cosine component; and
$BP_{(7)}$ is the third-order sine component.

For a particular desired beam pattern, e.g., $BP_{comp} = [0\ 0 - 3.1000i\ 0 + 2.3900i\ 0]$, the complex representation of the beam pattern can be multiplied by a rotation vector $$rot = [1 \exp(j^* th) \exp(j^* 2^* th) \exp(j^* 3^* th)],$$

as follows $$BPcompRot = rot.*BPcomp.$$

Thus, beam pattern above rotated by $\Phi = 45\text{-deg}$ ($\pi/4$ rad) becomes $[0\ 2.1920 - 2.1920i - 2.3900 + 0i\ 0]$. Taking the coefficients back out of complex notation, the rotated beam pattern, $BP_{Rot}$, becomes $[0\ 2.19 - 2.19 - 2.39\ 0\ 0\ 0]$, which yields the beam pattern shown in FIG. 21. As explained more fully below, the beam pattern shown in FIG. 21 is computed at a specific "Directivity Index."

Figure 22:
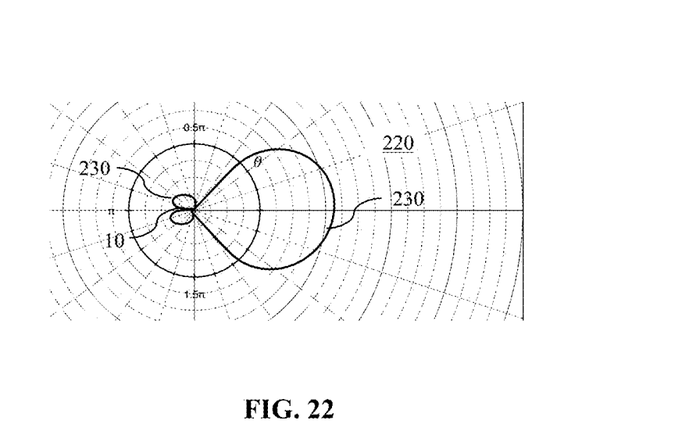
FIG. 22 illustrates an example of a sound field rendered based on a combination of modal components to approximate the desired sound field depicted in FIG. 5.
Figure 22A:
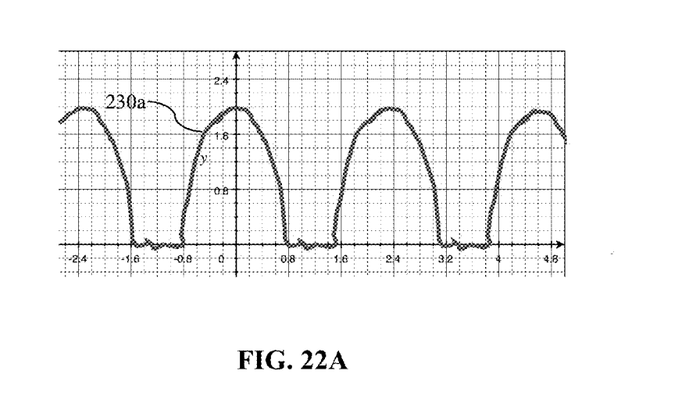
FIG. 22A illustrates the sound field shown in FIG. 21 plotted on the r-Θ plane using Cartesian coordinates, similar to the desired sound field depicted in FIG. 6.

FIGS. 22 and 22A schematically illustrate an approximation 230 to the sound field 130 depicted in FIGS. 5 and 6 generated using a combination of the modal components as described herein. In FIG. 22, the sound field 230 has a pair of lobes emitted generally opposite the main lobe, and the Cartesian representation of the sound field 230 has several ripples lacking from FIG. 6. Nonetheless, the sound field 230 can reflect a satisfactory approximation to the sound field 130 when considered in light of a user's experience.

For example, adding higher order modal components might to improve the accuracy of the approximation might not improve a user's experience, and yet consuming the computing resources (complexity) needed to calculate those higher-order components could detract from the user's overall experience. As well, adding higher order modal components could lead to increased cost, as a number of loudspeakers to implement disclosed techniques using N modes is 2*N+1. Thus, for example, to implement disclosed techniques with up to three modes can require at least 7 loudspeakers in the array. Although third-order modal components are shown and described above as providing a suitable balance between accuracy and available computational resources when measured against a user's experience, other embodiments can resolve the balance among accuracy, driver count, user experience, and computational complexity using different combinations of lower-order and/or higher-order modal components than expressly described herein.

V. Directivity Considerations

Many, if not most, audio devices exhibit differing degrees of directivity throughout the audible frequency range (e.g., about 20 Hz to about 20 kHz), with loudspeakers generally exhibiting lower directivity (e.g., being more omni-directional) in a low frequency band and exhibiting relatively higher directivity throughout mid- and high-frequency bands. A so-called Directivity Index (DI) can provide a non-dimensional measure of a loudspeaker's directivity. DI can reflect a measure of directed energy throughout a defined listening window (e.g., throughout a selected range of angular positions at a constant radius in an r-Θ plane having the loudspeaker positioned at the origin) divided by a measure of total acoustic energy emitted (e.g., throughout 360 degrees surrounding the loudspeaker).

Figure 23:
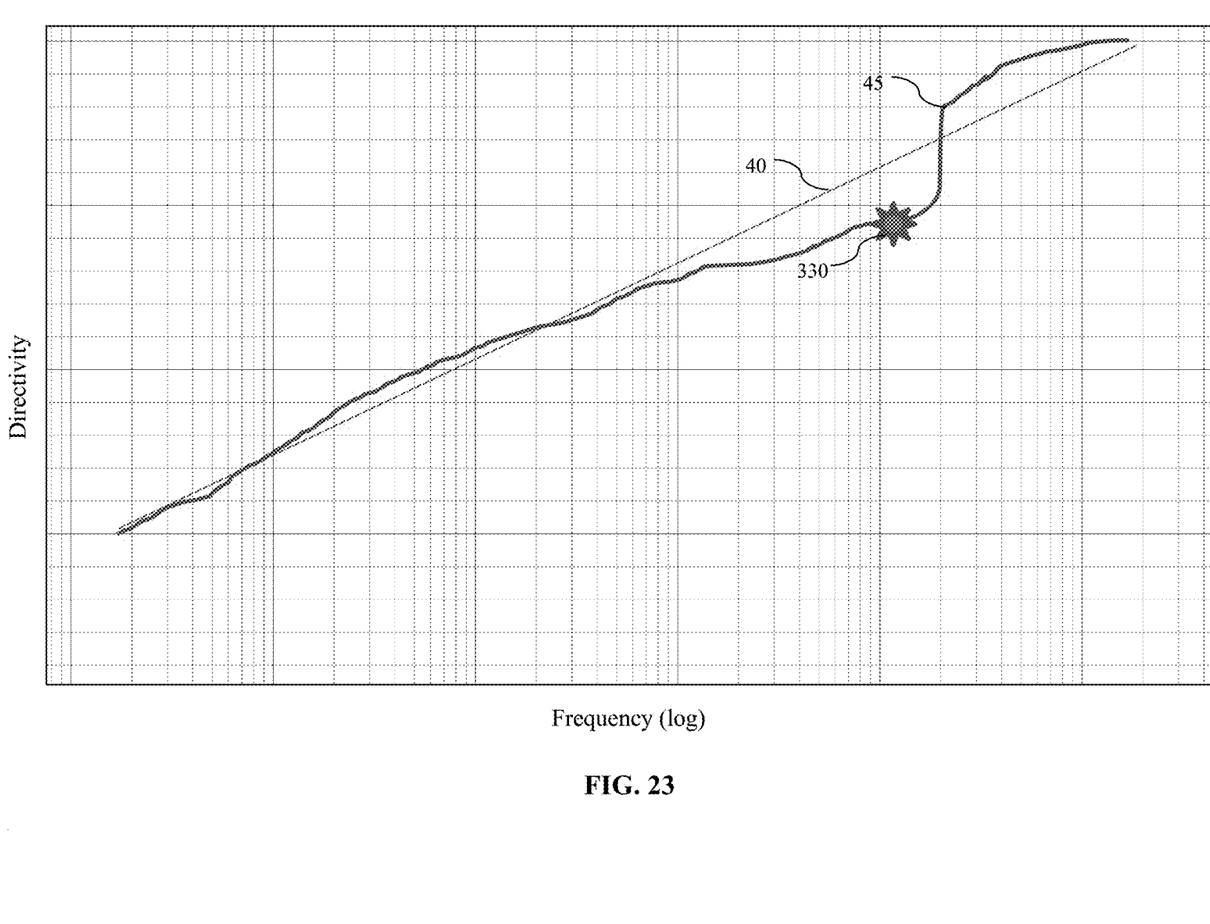
FIG. 23 illustrates a representative comparison of desired variation of directivity with frequency to actual variation of directivity with frequency.

FIG. 23 shows variation of DI with frequency. The straight line 40 represents one possible desired variation of DI with frequency, and the curve 45 schematically represents variation in DI for a real loudspeaker. Notably, the depicted DI variation for the real loudspeaker changes rapidly throughout a mid- and high-range frequency band. With a variation in DI as shown by the curve 45, a user's listening experience can be diminished if the user's position relative to the loudspeaker varies. Naturally, DI variation for a given loudspeaker can differ from the curve 45 shown. However, disclosed principles regarding DI variation with frequency remain intact.

A loudspeaker and/or an array of loudspeaker transducers having a variable DI will tend to render an acoustic beam whose shape changes with frequency. For example, certain frequencies will be enhanced or emphasized and other frequencies will be diminished at a given position within an acoustic beam rendered by a loudspeaker having a variable DI. This variation in DI also can affect a spectral balance of sound reflected by walls or other reflective surfaces in a room in which the audio device is placed. Since reflected sound also affects perceived sound characteristics of a loudspeaker, e.g., depending on when reflections arrive at a listener relative to directly emitted sound from the speaker, having the same or substantially similar spectral balance in reflected sound as in direct sound can be advantageous in producing a high quality listening experience. Alternatively, it might be desired to reproduce the perceived spectral characteristic of another loudspeaker without modifiable directivity. In this case purposefully modifying the directivity of the speaker to not be smoothly changing or flat can be advantageous in allowing the speaker to emulate the sound characteristics of another speakers. Even so, the beam forming techniques described above can be used to define a beam shape at a given frequency or over a narrow frequency band, as indicated by the star 334 overlaid on FIG. 23.

To achieve a desired beam shape or a smoothly varying beam shape (or pattern) over all listening frequencies, the modal beam components described above can undergo equalization so each modal beam component provides a corresponding sound field with a desired frequency response throughout the field. Stated differently, a filter can be designed to provide the desired frequency response throughout the modal beam component. And, the equalized modal beam components can then be combined to render a sound field having a smooth transition of beam shapes across the range of audible frequencies and/or selected frequency bands within the range of audible frequencies.

VI. Audio Processors

Figure 24:
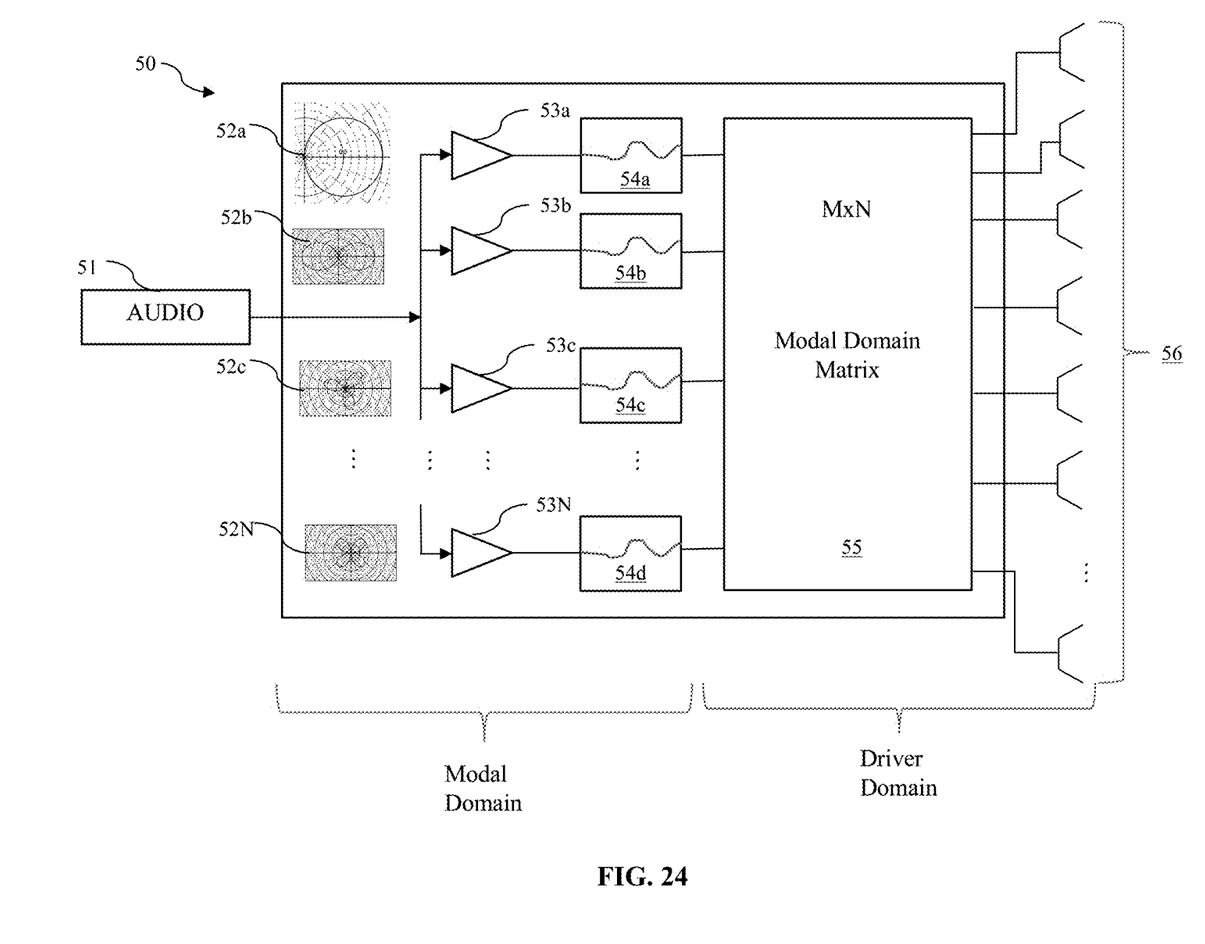
FIG. 24 illustrates a schematic block diagram of an audio device.

FIG. 24 shows a block diagram of an audio rendering processor 50 for an audio device 10 to playback an audio content (e.g., a musical work, or a movie sound track.

The audio rendering processor 50 may be a special purpose processor such as an application specific integrated circuit (ASIC), a general purpose microprocessor, a field-programmable gate array (FPGA), a digital signal controller, or a set of hardware logic structures (e.g., filters, arithmetic logic units, and dedicated state machines). In some instances, the audio rendering processor can be implemented using a combination of machine-executable instructions, that, when executed by a processor of an audio device, cause the audio device to process one or more input audio channels as described. The rendering processor 50 is to receive an input audio channel of a piece of sound program content from an input audio source 51. The input audio source 51 may provide a digital input or an analog input. The input audio source may include a programmed processor that is running a media player application program and may include a decoder that produces the digital audio input to the rendering processor. To do so, the decoder may be capable of decoding an encoded audio signal, which has been encoded using any suitable audio codec, e.g., Advanced Audio Coding (AAC), MPEG Audio Layer II, MPEG Audio Layer III, and Free Lossless Audio Codec (FLAC). Alternatively, the input audio source may include a codec that is converting an analog or optical audio signal, from a line input, for example, into digital form for the audio rendering processor 205. Alternatively, there may be more than one input audio channel, such as a two-channel input, namely left and right channels of a stereophonic recording of a musical work, or there may be more than two input audio channels, such as for example the entire audio soundtrack in 5.1-surround format of a motion picture film or movie. Other audio formats also are contemplated. Other particular examples are 7.1 and 9.1-surround formats.

The array of loudspeaker transducers 56 can render a desired sound field (or approximation thereof) based on a combination of modal beam components 52a . . . 52N applied to the audio content by the audio rendering processor 50. Rendering processors 50 according to FIG. 24 conceptually can be divided between a modal domain and a driver domain. In the modal domain, the weight (or gain, e.g., coefficients $\alpha_n$, $\beta_n$) 53a . . . 53N for each constituent modal beam component 52a . . . 52N can be applied to the audio content in correspondence with a desired beam shape in a manner as described above. An equalizer 54a . . . 54N can provide equalization to each respective modal beam component 52a . . . 52N to adjust for variation in DI arising from the particular audio device 10.

In the driver domain, a Modal Domain Matrix can be applied to the various modal-domain signals to provide a signal to be reproduced by each respective loudspeaker transducer in the array 56. Generally speaking the Modal Domain Matrix is an M×N sized matrix, with M=(2×O)+1, where O represents the highest order of modal beam components used, and N is the number of loudspeaker transducers in the array 56. In general, N≥M. Thus, to render a beam pattern using a combination of third-order components as described above, the audio device 10 should have at least seven loudspeaker transducers in the array of loudspeakers distributed around the cabinet 12 (e.g., exclusive of the supplemental loudspeaker transducer S0).

It should be understood the audio rendering processor 50 is capable of performing other signal processing operations in order to render the input audio signal for playback by the transducer array 56 in a desired manner. In another embodiment, in order to determine how much to modify the driver signal, the audio rendering processor may use one or more impulse responses estimated by, e.g., an adaptive filter process. In yet another embodiment, the audio device 10 may measure a separate impulse response of the acoustic environment, for use by the audio rendering processor 50 to modify the input audio signal 51.

VII. Computing Environments

Figure 25:
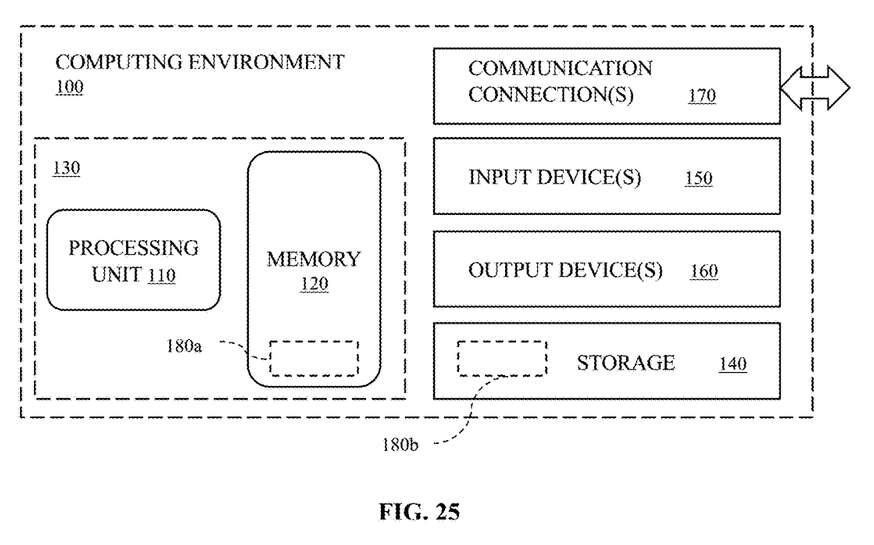
FIG. 25 shows a block diagram of a computing environment suitable for implementing disclosed methods.

FIG. 25 illustrates a generalized example of a suitable computing environment 100 in which described methods, embodiments, techniques, and technologies relating, for example, to procedurally generating an artificial terrain map. The computing environment 100 is not intended to suggest any limitation as to scope of use or functionality of the technologies disclosed herein, as each technology may be implemented in diverse general-purpose or special-purpose computing environments. For example, each disclosed technology may be implemented with other computer system configurations, including wearable and handheld devices (e.g., a mobile-communications device, or, more particularly but not exclusively, IPHONE®/IPAD® devices, available from Apple Inc. of Cupertino, Calif.), multiprocessor systems, microprocessor-based or programmable consumer electronics, embedded platforms, network computers, minicomputers, mainframe computers, smartphones, tablet computers, data centers, and the like. Each disclosed technology may also be practiced in distributed computing environments where tasks are performed by remote processing devices that are linked through a communications connection or network. In a distributed computing environment, program modules may be located in both local and remote memory storage devices.

The computing environment 100 includes at least one central processing unit 110 and memory 120. In FIG. 25, this most basic configuration 130 is included within a dashed line. The central processing unit 110 executes computer-executable instructions and may be a real or a virtual processor. In a multi-processing system, multiple processing units execute computer-executable instructions to increase processing power and as such, multiple processors can run simultaneously. The memory 120 may be volatile memory (e.g., registers, cache, RAM), non-volatile memory (e.g., ROM, EEPROM, flash memory, etc.), or some combination of the two. The memory 120 stores software 180a that can, for example, implement one or more of the innovative technologies described herein, when executed by a processor.

A computing environment may have additional features. For example, the computing environment 100 includes storage 140, one or more input devices 150, one or more output devices 160, and one or more communication connections 170. An interconnection mechanism (not shown) such as a bus, a controller, or a network, interconnects the components of the computing environment 100. Typically, operating system software (not shown) provides an operating environment for other software executing in the computing environment 100, and coordinates activities of the components of the computing environment 100.

The store 140 may be removable or non-removable, and can include selected forms of machine-readable media. In general machine-readable media includes magnetic disks, magnetic tapes or cassettes, non-volatile solid-state memory, CD-ROMs, CD-RWs, DVDs, magnetic tape, optical data storage devices, and carrier waves, or any other machine-readable medium which can be used to store information and which can be accessed within the computing environment 100. The storage 140 stores instructions for the software 180, which can implement technologies described herein.

The store 140 can also be distributed over a network so that software instructions are stored and executed in a distributed fashion. In other embodiments, some of these operations might be performed by specific hardware components that contain hardwired logic. Those operations might alternatively be performed by any combination of programmed data processing components and fixed hardwired circuit components.

The input device(s) 150 may be a touch input device, such as a keyboard, keypad, mouse, pen, touchscreen, touch pad, or trackball, a voice input device, a scanning device, or another device, that provides input to the computing environment 100. For audio, the input device(s) 150 may include a microphone or other transducer (e.g., a sound card or similar device that accepts audio input in analog or digital form), or a computer-readable media reader that provides audio samples to the computing environment 100.

The output device(s) 160 may be a display, printer, speaker transducer, DVD-writer, or another device that provides output from the computing environment 100.

The communication connection(s) 170 enable communication over a communication medium (e.g., a connecting network) to another computing entity. The communication medium conveys information such as computer-executable instructions, compressed graphics information, processed signal information (including processed audio signals), or other data in a modulated data signal.

Thus, disclosed computing environments are suitable for performing disclosed orientation estimation and audio rendering processes as disclosed herein.

Machine-readable media are any available media that can be accessed within a computing environment 100. By way of example, and not limitation, with the computing environment 100, machine-readable media include memory 120, storage 140, communication media (not shown), and combinations of any of the above. Tangible machine-readable (or computer-readable) media exclude transitory signals.

As explained above, some disclosed principles can be embodied in a tangible, non-transitory machine-readable medium (such as microelectronic memory) having stored thereon instructions, which program one or more data processing components (generically referred to here as a "processor") to perform the digital signal processing operations described above including estimating, adapting, computing, calculating, measuring, adjusting (by the audio rendering processor 50), sensing, measuring, filtering, addition, subtraction, inversion, comparisons, and decision making. In other embodiments, some of these operations (of a machine process) might be performed by specific electronic hardware components that contain hardwired logic (e.g., dedicated digital filter blocks). Those operations might alternatively be performed by any combination of programmed data processing components and fixed hardwired circuit components.

The audio device 10 can include a loudspeaker cabinet 12 configured to produce sound. The audio device 10 can also include a processor, and a non-transitory machine readable medium (memory) in which instructions are stored which when executed by the processor automatically perform an orientation detection process as described herein.

X. Other Embodiments

The examples described above generally concern apparatus, methods, and related systems for rendering audio, and more particularly but not exclusively, to providing desired acoustic beam patterns. Nonetheless, embodiments other than those described above in detail are contemplated based on the principles disclosed herein, together with any attendant changes in configurations of the respective apparatus described herein.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by reference in its entirety for all purposes.

The principles described above in connection with any particular example can be combined with the principles described in connection with another example described herein. Accordingly, this detailed description shall not be construed in a limiting sense, and following a review of this disclosure, those of ordinary skill in the art will appreciate the wide variety of signal processing and audio rendering techniques that can be devised using the various concepts described herein.

Moreover, those of ordinary skill in the art will appreciate that the exemplary embodiments disclosed herein can be adapted to various configurations and/or uses without departing from the disclosed principles. Applying the principles disclosed herein, it is possible to provide a wide variety of systems adapted to providing a desired sound field. For example, modules identified as constituting a portion of a given computational engine in the above description or in the drawings can be partitioned differently than described herein, distributed among one or more modules, or omitted altogether. As well, such modules can be implemented as a portion of a different computational engine without departing from some disclosed principles.

The previous description of the disclosed embodiments is provided to enable any person skilled in the art to make or use the disclosed innovations. Various modifications to those embodiments will be readily apparent to those skilled in the art, and the generic principles defined herein may be applied to other embodiments without departing from the spirit or scope of this disclosure. Thus, the claimed inventions are not intended to be limited to the embodiments shown herein, but are to be accorded the full scope consistent with the language of the claims, wherein reference to an element in the singular, such as by use of the article "a" or "an" is not intended to mean "one and only one" unless specifically so stated, but rather "one or more". All structural and functional equivalents to the features and method acts of the various embodiments described throughout the disclosure that are known or later come to be known to those of ordinary skill in the art are intended to be encompassed by the features described and claimed herein. Moreover, nothing disclosed herein is intended to be dedicated to the public regardless of whether such disclosure is explicitly recited in the claims. No claim recitation is to be construed under the provisions of 35 USC 112(f), unless the recitation is expressly recited using the phrase "means for" or "step for".

Thus, in view of the many possible embodiments to which the disclosed principles can be applied, we reserve to the right to claim any and all combinations of features and technologies described herein as understood by a person of ordinary skill in the art, including, for example, all that comes within the scope and spirit of the following claims.

We currently claim:

1. An audio system, comprising:
   a loudspeaker cabinet to house an array of loudspeaker transducers constituting a portion of an acoustic beam former; and
   a processor and a memory housed in the loudspeaker cabinet, wherein the memory contains instructions that, when executed by the processor, cause the audio system to
   apply a frequency equalization to at least one of a plurality of modal beam components to compensate for a spectral-variation in directivity of the audio system;
      estimate a shape of a desired sound field as a weighted combination of the equalized modal beam components;
      receive an audio signal containing an audio content;
      for each loudspeaker transducer in the array, apply a respective filter to the received audio signal according to the weighted combination of equalized modal beam components; and
      at each loudspeaker transducer, emit the filtered audio signal for the respective loudspeaker transducer to render the audio content throughout a sound field corresponding to the desired sound field.

2. The audio system according to claim 1, wherein the instructions, when executed by the processor, further cause the audio system to receive an input corresponding to a listening environment, and, based at least in part on the input, to determine the shape of the desired sound field and to decompose the shape of the desired sound field into a corresponding weighted combination of the modal beam components.

3. The audio system according to claim 2, wherein the input associated with the shape of the desired sound field comprises a user input representative of a listening environment.

4. The audio system according to claim 2, wherein the input associated with the shape of the desired sound field comprises a sensor input indicative of the environment in which the audio system is installed.

5. The audio system according to claim 2, wherein the instructions, when executed, further cause the audio system to perform a Fourier decomposition of the shape of the desired sound field into the weighted combination of modal shapes.

6. The audio system according to claim 1, wherein a cross-sectional profile of the loudspeaker cabinet defines a circle, and wherein the array of loudspeaker transducers is distributed around an outer surface of the loudspeaker cabinet.

7. The audio system according to claim 6, wherein the loudspeaker cabinet comprises a cylindrical portion defining a central longitudinal axis and the array of loudspeaker transducers are circumferentially distributed around the central longitudinal axis.

8. A method of rendering audio content with an audio system comprising a loudspeaker cabinet and a plurality of loudspeaker transducers positioned about the loudspeaker cabinet, the method comprising:
   applying a frequency equalization to at least one of a plurality of modal beam components to compensate for spectral-variation in directivity of the plurality of loudspeaker transducers;
   estimating a shape of a desired sound field as a weighted combination of the equalized modal beam components;
   receiving an audio signal containing the audio content;
   for each respective loudspeaker transducer, applying a corresponding filter to the received audio signal according to the weighted combination of equalized modal beam components; and
   emitting from each respective loudspeaker transducer the filtered audio signal corresponding to the respective loudspeaker transducer to render the audio content throughout a sound field corresponding to the shape of the desired sound field.

9. The method according to claim 8, further comprising receiving an input associated with the shape of the desired sound field, and, based at least in part on the input, determining the shape of the desired sound field and decomposing the shape of the desired sound field into a corresponding weighted combination of modal shapes.

10. The method according to claim 9, wherein the input associated with the shape of the desired sound field comprises a user input representative of a listening environment.

11. The method according to claim 9, wherein the input associated with the shape of the desired sound field comprises a sensor input indicative of the environment in which the audio system is installed.

12. The method according to claim 11, further comprising performing a Fourier decomposition of the shape of the desired sound field into the weighted combination of modal shapes.

13. The audio system according to claim 8, wherein the loudspeaker cabinet comprises a cylindrical body defining a central longitudinal axis and the array of loudspeaker transducers is distributed evenly around the central longitudinal axis.

14. An article of manufacture, comprising a tangible, non-transitory computer readable media containing instructions, that, when executed by a processor of an audio system having a loudspeaker cabinet and a plurality of loudspeaker transducers spatially distributed about and physically coupled with the cabinet, cause the audio system to
   apply a frequency equalization to at least one of a plurality of modal beam components to compensate for a spectral-variation in directivity of the audio system;
   estimate a shape of a desired sound field as a weighted combination of the equalized modal beam components;
   receive an audio signal containing an audio content;
   for each loudspeaker transducer, filter the received audio signal according to the respective combination of modal shapes; and
   at each loudspeaker transducer, emit the filtered audio signal for the respective loudspeaker transducer to render the audio content throughout a sound field corresponding to the desired sound field.

15. The article according to claim 14, wherein the instructions, when executed by the processor, further cause the audio system to receive an input corresponding to a listening environment, and, based at least in part on the input, to determine the shape of the desired sound field and to decompose the shape of the desired sound field into a corresponding weighted combination of the modal beam components.

16. The article according to claim 15, wherein the input associated with the shape of the desired sound field comprises a user input defining the shape of the desired sound field.

17. The article according to claim 15, wherein the instructions, when executed, further cause the audio system to perform a Fourier decomposition of the shape of the desired sound field into the weighted combination of modal beam components.

18. The audio system according to claim 3, wherein the user input representative of a listening environment comprises a user input indicative of a room arrangement and a listening position within the room arrangement relative to a position of the audio system.

19. The method according to claim 10, wherein the user input representative of a listening environment comprises a user input indicative of a room arrangement and a listening position within the room arrangement relative to a position of the audio system.

20. The article according to claim 15, the input corresponding to a listening environment comprises a user input indicative of a room arrangement and a listening position within the room arrangement relative to a position of the audio system.

* * * * *